United States Patent
Lim et al.

(10) Patent No.: US 9,818,891 B2
(45) Date of Patent: Nov. 14, 2017

(54) SOLAR CELL MODULE AND METHOD FOR MANUFACTURING THE SAME

(71) Applicant: LG ELECTRONICS INC., Seoul (KR)

(72) Inventors: Kwangyoung Lim, Seoul (KR); Kangseok Moon, Seoul (KR); Jeonghun Son, Seoul (KR); Sehwon Ahn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/985,113

(22) Filed: Dec. 30, 2015

(65) Prior Publication Data

US 2016/0190363 A1    Jun. 30, 2016

(30) Foreign Application Priority Data

Dec. 31, 2014  (KR) .................. 10-2014-0195636
Jul. 8, 2015   (KR) .................. 10-2015-0097115

(51) Int. Cl.
  *H01L 31/0224* (2006.01)
  *H01L 31/0216* (2014.01)
  *H01L 31/05* (2014.01)
  *H01L 31/068* (2012.01)

(52) U.S. Cl.
  CPC .. *H01L 31/022425* (2013.01); *H01L 31/0504* (2013.01); *H01L 31/0508* (2013.01); *H01L 31/0516* (2013.01); *H01L 31/068* (2013.01); *Y02E 10/547* (2013.01)

(58) Field of Classification Search
  None
  See application file for complete search history.

(56) References Cited

U.S. PATENT DOCUMENTS

| | | | |
|---|---|---|---|
| 2008/0216887 | A1 | 9/2008 | Hacke et al. |
| 2011/0139243 | A1 | 6/2011 | Shim et al. |
| 2011/0204126 | A1 | 8/2011 | Von Campe et al. |
| 2012/0291844 | A1* | 11/2012 | Tsuge ............ H01L 31/022425 136/244 |
| 2013/0000718 | A1 | 1/2013 | Tsao |
| 2013/0042912 | A1* | 2/2013 | Kurihara ............ B23K 35/262 136/256 |

(Continued)

FOREIGN PATENT DOCUMENTS

| | | |
|---|---|---|
| DE | 102006035626 A1 | 2/2008 |
| JP | 5-110122 A | 4/1993 |

(Continued)

*Primary Examiner* — Khaja Ahmad
(74) *Attorney, Agent, or Firm* — Birch, Stewart, Kolash & Birch, LLP

(57) ABSTRACT

A solar cell module and a method for manufacturing the same are disclosed. The method for manufacturing the solar cell module includes applying a low melting point metal on an electrode included in each of a plurality of solar cells, melting the low melting point metal to form a contact layer on the electrode, generating an ultrasonic vibration in the contact layer to remove a surface oxide layer formed on a surface of the electrode, melting a surface metal of the electrode and the contact layer to form a metal connection layer on the surface of the electrode, and connecting the metal connection layer to an interconnector.

20 Claims, 16 Drawing Sheets

(56) References Cited

U.S. PATENT DOCUMENTS

2013/0312827 A1* 11/2013 Adachi ........... H01L 31/022425
 136/256
2013/0333744 A1 12/2013 Yokochi et al.
2014/0124027 A1 5/2014 Teshima et al.

FOREIGN PATENT DOCUMENTS

| | | |
|---|---|---|
| JP | 5-259487 A | 10/1993 |
| JP | 6-209115 A | 7/1994 |
| JP | 6-283735 A | 10/1994 |
| JP | 8-264819 A | 10/1996 |
| JP | 11-21660 A | 1/1999 |
| JP | 2008-294366 A | 12/2008 |
| JP | 2011-181924 A | 9/2011 |
| JP | 2012-4289 A | 1/2012 |
| JP | 2012-109423 A | 6/2012 |
| JP | WO2012/165590 A1 | 12/2012 |
| JP | WO2013/024829 A1 | 2/2013 |
| JP | 2013-526053 A | 6/2013 |
| JP | 2013-143459 A | 7/2013 |
| JP | 2014-107403 A | 6/2014 |
| WO | WO 2012/102076 A1 | 8/2012 |

* cited by examiner

SOLAR CELL MODULE AND METHOD FOR MANUFACTURING THE SAME

CROSS-REFERENCE TO RELATED APPLICATIONS

This application claims priority to and the benefit of Korean Patent Application Nos. 10-2014-0195636 and 10-2015-0097115 filed in the Korean Intellectual Property Office on Dec. 31, 2014 and Jul. 8, 2015 the entire contents of which are incorporated herein by reference.

BACKGROUND OF THE INVENTION

Field of the Invention

Embodiments of the invention relate to a solar cell module and a method for manufacturing the same.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

SUMMARY OF THE INVENTION

In one aspect, there is a method for manufacturing a solar cell module including positioning at least one of a plurality of solar cells, each including a semiconductor substrate, an emitter region forming a p-n junction along with the semiconductor substrate, a second anti-reflection layer formed on a front surface of the semiconductor substrate, a first anti-reflection layer formed on a back surface of the semiconductor substrate, a front electrode connected to the emitter region, and a back electrode connected to a back surface field region, on a pad; applying a low melting point metal on the front electrode and the back electrode; melting the low melting point metal to form a contact layer on the front electrode and the back electrode; generating an ultrasonic vibration in the contact layer to remove a surface oxide layer formed on a surface of the front electrode and a surface of the back electrode; melting a surface metal and the low melting point metal of at least one of the front electrode and the back electrode to form a metal connection layer on the surface of the front electrode and the surface of the back electrode; and connecting the metal connection layer to an interconnector.

The removing of the surface oxide layer may include generating the ultrasonic vibration in a surface of the contact layer; generating a cavitation phenomenon inside the contact layer by the ultrasonic vibration; and removing the surface oxide layer formed on the surface of the front electrode and the surface of the back electrode by the cavitation phenomenon.

The forming of the front electrode and the back electrode may include applying a high melting point metal on the back surface of the semiconductor substrate, generating the ultrasonic vibration in the high melting point metal to form the back electrode, applying a low melting point metal on the front surface opposite the back surface of the semiconductor substrate, and generating the ultrasonic vibration in the low melting point metal to form the front electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
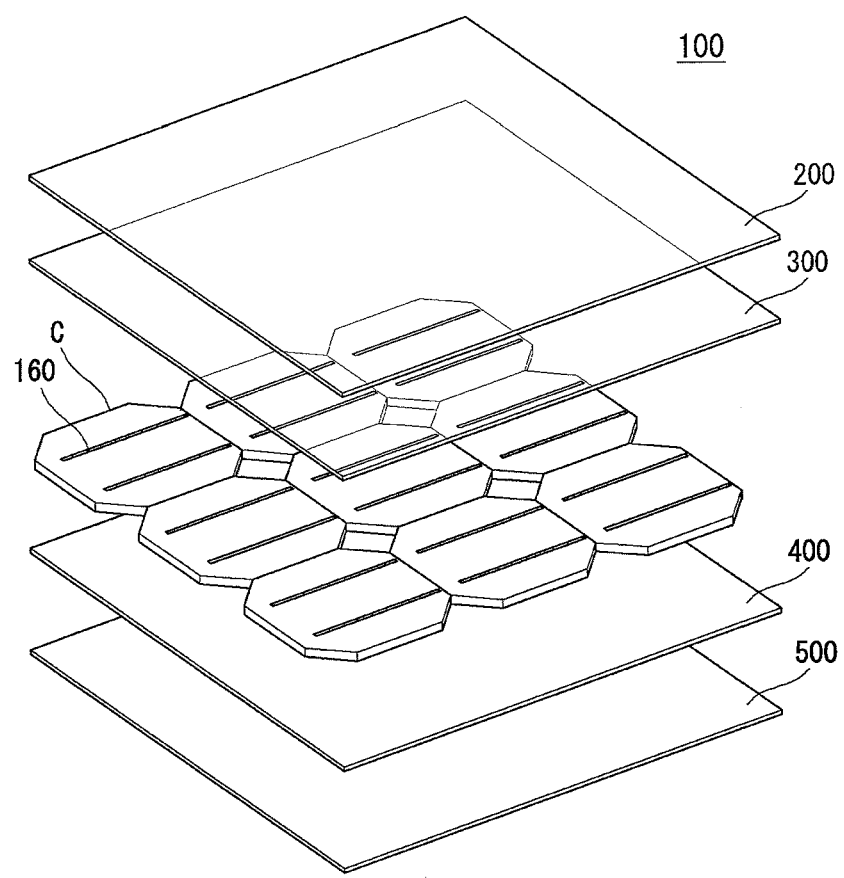
FIG. 1 is an exploded perspective view of a solar cell module according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

The fact that any two values are equal to each other means that the two values are equal to each other within a margin of error of 10% or less.

Exemplary embodiments of the invention are described with reference to FIGS. 1 to 12.

FIGS. 1 and 2 illustrate a solar cell module according to an example embodiment of the invention.

Figure 2A:
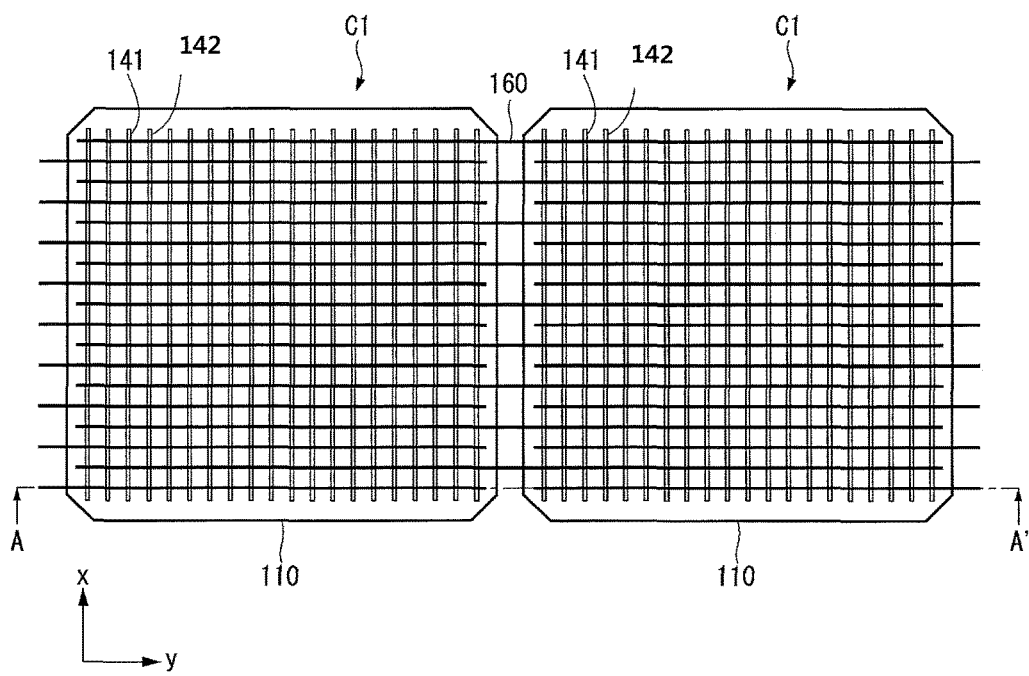
FIG. 2A illustrates a shape of a solar cell module according to an example embodiment of the invention when viewed from a front surface.
Figure 2B:
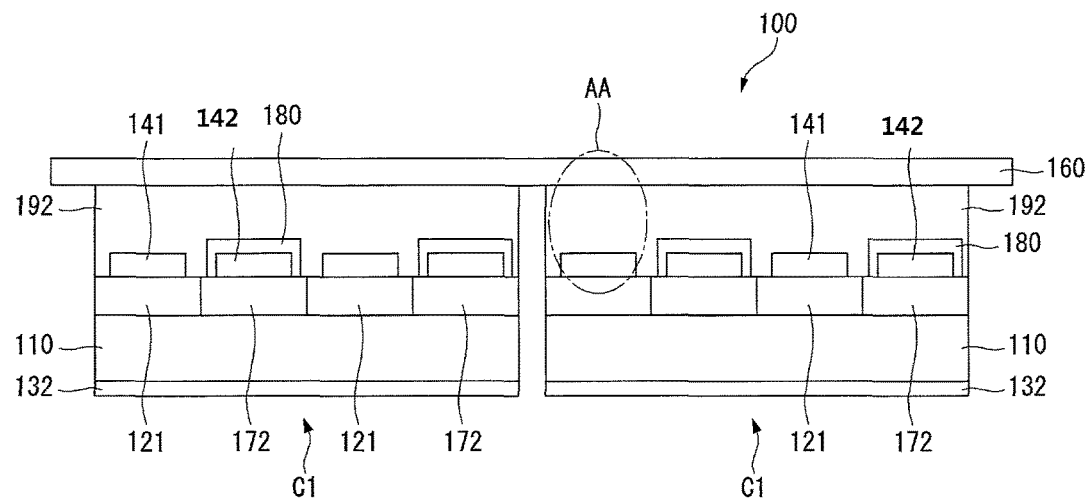
FIG. 2B is a cross-sectional view taken along line A'-A' of FIG. 2A.
Figure 2C:
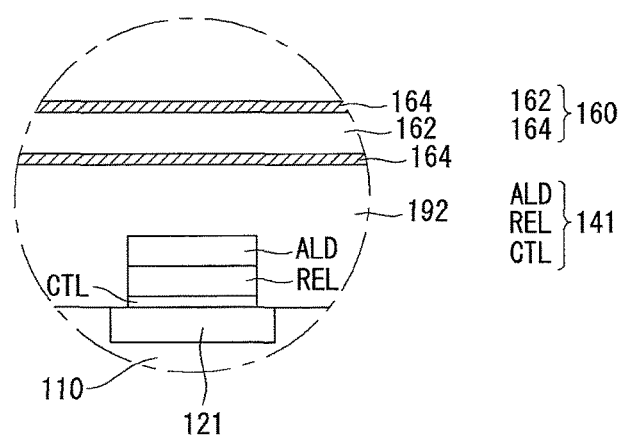
FIG. 2C is an enlarged view of a portion AA shown in FIG. 2B.

More specifically, FIG. 1 is an exploded perspective view of a solar cell module according to an example embodiment of the invention. FIG. 2A illustrates a shape of a solar cell module according to an example embodiment of the invention when viewed from a front surface, FIG. 2B is a cross-sectional view taken along line A'-A' of FIG. 2A, and FIG. 2C is an enlarged view of a portion AA shown in FIG. 2B.

Referring to FIGS. 1 and 2, a solar cell module 100 according to the embodiment of the invention includes a plurality of solar cells C, interconnectors 160 electrically connecting the plurality of solar cells C, a front protective layer 300 and a back protective layer 400 for protecting the plurality of solar cells C, a transparent member 200 positioned on the front protective layer 300 at light receiving surfaces of the solar cells C, and a back sheet 500 of an opaque material positioned under the back protective layer 400 at surfaces opposite the light receiving surfaces of the solar cells C.

The transparent member 200 is formed of a tempered glass having a high transmittance and a damage prevention function. In this instance, the tempered glass may be a low iron tempered glass containing a small or a low amount of iron. The transparent member 200 may have an embossed inner surface or a textured inner surface, so as to increase a scattering effect of light.

The front protective layer 300 and the back protective layer 400 are integrated with the solar cells C through a lamination process in a state where they are respectively disposed on and under the solar cells C. Each of the front protective layer 300 and the back protective layer 400 may be an encapsulant for preventing corrosion resulting from the moisture penetration and protecting the solar cells C and the solar cell module 100 from an impact.

The front protective layer 300 and the back protective layer 400 may be formed of ethylene vinyl acetate (EVA), polyvinyl butyral, silicon resin, ester-based resin, olefin-based resin, and the like. Other materials may be used.

The back sheet 500 can prevent moisture and oxygen from penetrating into a back surface of the solar cell module 100 and protect the solar cells C from an external environment. The back sheet 500 may have a multi-layered structure including a moisture/oxygen penetrating prevention layer, a chemical corrosion prevention layer, an insulation layer, etc. In this instance, the back sheet 500 may be formed using a thin sheet formed of an insulating material such as fluoropolymer/polyester/fluoropolymer (FP/PE/FP). An insulating sheet formed of other insulating materials may be used.

An example of a first solar cell C1 applicable to the solar cell module 100 according to the embodiment of the invention is shown in FIG. 2.

Referring to FIGS. 2A to 2C, a first solar cell C1 according to a first embodiment of the invention may include an anti-reflection layer 132, a semiconductor substrate 110, a plurality of emitter regions 121, a plurality of back surface field regions 172, a first electrode 141, and a second electrode 142.

In the embodiment disclosed herein, the anti-reflection layer 132 may be omitted, if desired or necessary. However, when the solar cell C1 includes the anti-reflection layer 132, efficiency of the solar cell C1 may be further improved. Thus, the embodiment of the invention is described using the solar cell including the anti-reflection layer 132, as an example.

The semiconductor substrate 110 may be formed of at least one of single crystal silicon and polycrystalline silicon containing impurities of a first conductive type. For example, the semiconductor substrate 110 may be formed of a single crystal silicon wafer.

In the embodiment disclosed herein, the first conductive type may be one of an n-type and a p-type.

When the semiconductor substrate 110 is of the p-type, the semiconductor substrate 110 may be doped with impurities of a group III element, such as boron (B), gallium (Ga), and indium (In). Alternatively, when the semiconductor substrate 110 is of the n-type, the semiconductor substrate 110 may be doped with impurities of a group V element, such as phosphorus (P), arsenic (As), and antimony (Sb).

In the following description, the embodiment of the invention is described using an example where the first conductive type is the n-type.

A front surface of the semiconductor substrate 110 may be a textured surface having a plurality of protrusion or having uneven characteristics. Thus, the anti-reflection layer 132 positioned on the front surface of the semiconductor substrate 110 may have a textured surface.

Hence, an amount of light reflected from the front surface of the semiconductor substrate 110 may decrease, and an amount of light incident on the inside of the semiconductor substrate 110 may increase.

The anti-reflection layer 132 is positioned on the front surface of the semiconductor substrate 110 and may be formed of at least one of aluminum oxide (AlOx), silicon nitride (SiNx), silicon oxide (SiOx), and silicon oxynitride (SiOxNy), thereby minimizing the reflection of light incident on the front surface of the semiconductor substrate 110 from the outside. As shown in FIG. 2B, the anti-reflection layer 132 may have a single layer. Alternatively, the anti-reflection layer 132 may have a plurality of layers.

The plurality of emitter regions 121 may directly contact a portion of a back surface of the semiconductor substrate 110 and may be separated from one another. The plurality of emitter regions 121 may extend in a first direction x.

The emitter region 120 may be formed of a polycrystalline silicon material of a second conductive type opposite the conductive type (i.e., the first conductive type) of the semiconductor substrate 110. Thus, the emitter region 120 may form a p-n junction along with the semiconductor substrate 110.

Because each emitter region 121 forms the p-n junction along with the semiconductor substrate 110, the emitter region 121 may be of the p-type. However, if the semiconductor substrate 110 is of the p-type unlike the embodiment described above, the emitter region 121 may be of the n-type. In this instance, separated electrons may move to the plurality of emitter regions 121, and separated holes may move to the plurality of back surface field regions 172.

Returning to the embodiment of the invention, when the emitter region 121 is of the p-type, the emitter region 121 may be doped with impurities of a group III element, such as B, Ga, and In. On the contrary, if the emitter region 121 is of the n-type, the emitter region 121 may be doped with impurities of a group V element, such as P, As, and Sb.

The plurality of back surface field regions 172 may be positioned at the back surface of the semiconductor substrate 110, on which the plurality of emitter regions 121 are not positioned, and may directly contact the back surface of the semiconductor substrate 110. The plurality of back surface field regions 172 may extend in the same first direction x as the plurality of emitter regions 121.

The back surface field regions 172 may be formed of a polycrystalline silicon material doped with impurities of the first conductive type at a higher concentration than the semiconductor substrate 110. Thus, when the semiconductor substrate 110 is doped with, for example, n-type impurities, the plurality of back surface field regions 172 may be an $n^+$-type region.

A potential barrier is formed by a difference between impurity concentrations of the semiconductor substrate 110 and the back surface field regions 172. Hence, the back surface field regions 172 can prevent or reduce holes from moving to the back surface field regions 172 used as a moving path of electrons through the potential barrier and can make it easier for carriers (for example, electrons) to move to the back surface field regions 172.

Thus, the back surface field regions 172 can reduce an amount of carriers lost by a recombination and/or a disappearance of electrons and holes at and around the back surface field regions 172 or at and around the first and second electrodes 141 and 142, and can accelerate a movement of electrons, thereby increasing an amount of electrons moving to the back surface field regions 172.

The first electrode 141 may be connected to each emitter region 121 and may collect carriers (for example, holes) moving to the corresponding emitter region 121.

The second electrode 142 may be connected to each back surface field region 172 and may collect carriers (for example, electrons) moving to the corresponding back surface field region 172.

Referring to FIG. 2C, each of the first and second electrodes 141 and 142 may include an adhesive metal layer CTL, a light reflection metal layer REL, and an anti-diffusion metal layer ALD.

The adhesive metal layer CTL is positioned on and directly connected to a back surface of the emitter region 121 or a back surface of the back surface field region 172. The adhesive metal layer CTL may have light transmission characteristic. The adhesive metal layer CTL may have a light transmittance of 50% to 100%. More specifically, the adhesive metal layer CTL may have the light transmittance of 80% to 100%.

The adhesive metal layer CTL may have a thermal expansion coefficient within the range between a thermal expansion coefficient of the emitter region 121 or the back surface field region 172 and a thermal expansion coefficient of the light reflection metal layer REL, so as to minimize a thermal expansion stress resulting from a difference between the thermal expansion coefficient of the emitter region 121 containing a silicon material or the back surface field region 172 containing a silicon material and the thermal expansion coefficient of the light reflection metal layer REL. Hence, the adhesive metal layer CTL can minimize the thermal expansion stress resulting from the difference between the thermal expansion coefficient of the emitter region 121 or the back surface field region 172 and the thermal expansion coefficient of the light reflection metal layer REL and can further improve contact characteristic.

For example, the adhesive metal layer CTL may include titanium (Ti) or tungsten (W) having the above-described thermal expansion coefficient.

A thickness of the adhesive metal layer CTL may be equal to or less than 50 nm, so as to sufficiently reduce the thermal expansion stress between the emitter region 121 or the back surface field region 172 and the light reflection metal layer REL. Preferably, the thickness of the adhesive metal layer CTL may be 5 nm to 10 nm.

The light reflection metal layer REL may be positioned on a back surface of the adhesive metal layer CTL and may have a reflection function of light at an interface between the adhesive metal layer CTL and the light reflection metal layer REL. Thus, when the light reflection metal layer REL is positioned on and directly connected to the back surface of the adhesive metal layer CTL, the light reflection metal layer REL may again reflect light of a long wavelength band, that passes through the semiconductor substrate 110 and the emitter region 121 or the back surface field region 172, on the semiconductor substrate 110 and thus may further improve the efficiency of the solar cell.

The light reflection metal layer REL may include gold (Au), silver (Ag), copper (Cu), aluminum (Al), or an alloy thereof, so as to secure the above-described reflection function of light.

A thickness of the light reflection metal layer REL may be equal to or greater than the thickness of the adhesive metal layer CTL, so as to sufficiently secure the above-described reflection function of light.

The anti-diffusion metal layer ALD may be positioned on a back surface of the light reflection metal layer REL. For example, the anti-diffusion metal layer ALD may directly contact the light reflection metal layer REL. The anti-diffusion metal layer ALD may include nickel-vanadium (NiV) alloy or tin (Sn).

A thickness of the anti-diffusion metal layer ALD may be equal to or greater than the thickness of the light reflection metal layer REL.

A metal connection layer 192 may be positioned between the first and second electrodes 141 and 142 and the interconnector 160 and may electrically connect the first and second electrodes 141 and 142 to the interconnector 160.

The metal connection layer 192 may directly contact a portion of the emitter region 121 and a portion of the back surface field region 172 except an insulating layer 180 formed by surrounding the first electrode 141, the second electrode 142, or the first and second electrodes 141 and 142.

The metal connection layer 192 may be formed of a low melting point metal that forms metal melting bonding along with at least one of the first and second electrodes 141 and 142 and the interconnector 160.

The metal connection layer 192 may be formed on the surfaces of the first and second electrodes 141 and 142 by melting a surface metal of at least one of the first and second electrodes 141 and 142 and the low melting point metal. Examples of the low melting point metal may include tin (Sn), bismuth (Bi), lead (Pb), cadmium (Cd), a metal material having a chemical formula indicated by SnIn, SnBi, SnPb, SnAg SnSb, SnZn, SnCuAg, and SnCu, or a combination thereof. In this instance, a melting point of tin (Sn) is 232° C., a melting point of bismuth (Bi) is 271° C., a melting point of lead (Pb) is 327° C., and a melting point of cadmium (Cd) is 321° C. Further, a melting point of SnIn is 117° C., a melting point of SnBi is 138° C., and a melting point of SnPb is 186° C. In embodiments of the invention, the surface metal of the at least one of the first and second electrodes 141 and 142 may refer to a surface portion or a portion of a top portion of the at least one of the first and second electrodes 141 and 142.

The interconnector 160 may electrically connect the plurality of first solar cells C1 and may be electrically and physically connected to the metal connection layer 192. In this instance, the interconnector 160 may electrically connect the adjacent first solar cells C1 in series.

The interconnector 160 may have a wire shape and may include a conductive metal 162 and a coating layer 164 formed of a solder coated on a surface of the conductive metal 162. A diameter of the interconnector 160 may be about 300 μm to 380 μm, and a thickness of the coating layer 164 may be about 5 μm to 20 μm. The number of interconnectors 160 used to connect the plurality of first solar cells C1 may be 10 to 18.

The conductive metal 162 may be formed of a conductive material with good conductivity, for example, nickel (Ni), copper (Cu), silver (Ag), and aluminum (Al). The coating layer 164 may be formed of a low melting point metal.

Because the coating layer 164 is formed of the low melting point metal, at least one of the metal connection layer 192 and the coating layer 164 may be melted by heat applied in a process for bonding the interconnector 160 to the first solar cell C1 and may form the metal melting bonding along with the metal connection layer 192. Examples of the low melting point metal may include tin (Sn), bismuth (Bi), lead (Pb), cadmium (Cd), a metal material having a chemical formula indicated by SnIn, SnBi, SnPb, SnAg SnSb, SnZn, SnCuAg, and SnCu, or a combination thereof. In this instance, a melting point of tin (Sn) is 232° C., a melting point of bismuth (Bi) is 271° C., a melting point of lead (Pb) is 327° C., and a melting point of cadmium (Cd) is 321° C. Further, a melting point of SnIn is 117° C., a melting point of SnBi is 138° C., and a melting point of SnPb is 186° C.

The low melting point metal of the metal connection layer 192 and the low melting point metal of the coating layer 164 may be formed of the same material or different materials.

When the low melting point metal of the metal connection layer 192 and the low melting point metal of the coating layer 164 are formed of the same material, a coupling strength between the interconnector 160 and the metal connection layer 192 may be improved and a contact resistance therebetween may be minimized. Hence, the efficiency of the solar cell may be maximized.

Even when the low melting point metal of the metal connection layer 192 and the low melting point metal of the coating layer 164 are formed of different materials, the coupling strength between the interconnector 160 and the metal connection layer 192 may be maintained because both the metal connection layer 192 and the coating layer 164 include the low melting point metal.

The interconnector 160 may be insulated from the first electrode 141 or the second electrode 142 at a crossing of the interconnector 160 and the first electrode 141 or the second electrode 142 using the insulating layer 180. The insulating layer 180 may be formed of an insulating resin, for example, epoxy.

Figure 3A:
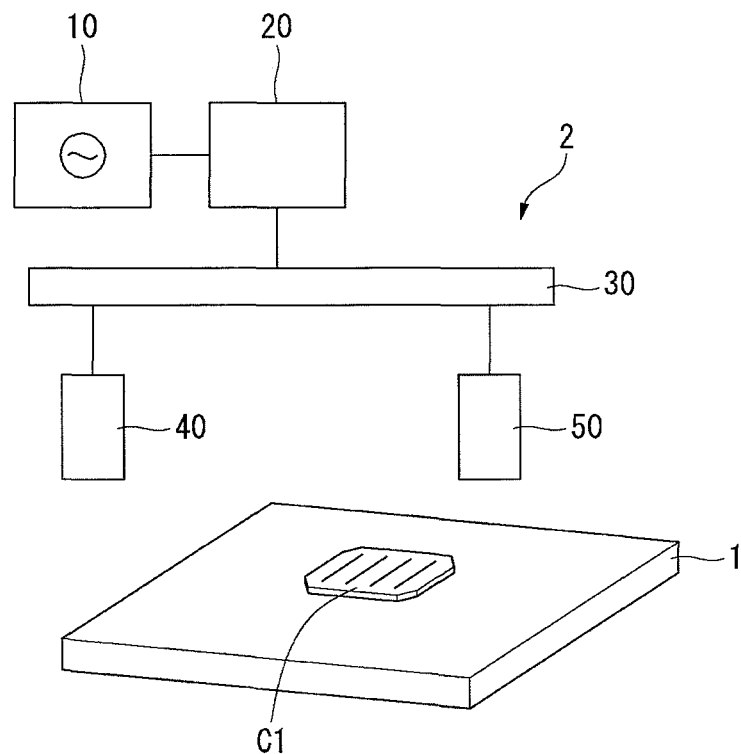
FIG. 3A illustrates configuration of an ultrasonic soldering device.
Figure 3B:
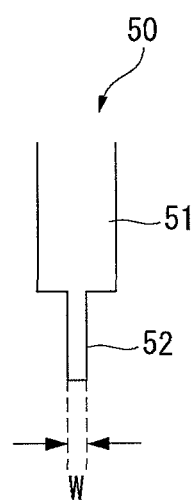
FIG. 3B illustrates in detail an ultrasonic generator shown in FIG. 3A.

FIG. 3A illustrates configuration of an ultrasonic soldering device, and FIG. 3B illustrates in detail an ultrasonic generator shown in FIG. 3A.

As shown in FIG. 3A, an ultrasonic soldering device 2 may include a pad 1 on which the first solar cell C1 is positioned, a power unit 10 for supplying electric power to the ultrasonic soldering device 2, a controller 20 for controlling the ultrasonic soldering device 2, a driver 30 driven in accordance with a command of the controller 20, a solder supply unit 40 for supplying a solder 42 in accordance with an operation of the driver 30, and an ultrasonic generator 50 generating ultrasonic waves.

The solder supply unit 40 may supply the solder 42 forming the metal connection layer 192. In this instance, the solder 42 of a solid state may be supplied, and the plurality of solders 42 each having a predetermined size may be used.

The solder supply unit 40 may adjust a supply speed of the solder 42 and control the size of the supplied solder 42.

More specifically, when the solder 42 is supplied at a high speed, the size of the solder 42 may decrease. Hence, the solder supply unit 40 may easily dispose the solder 42 on the first and second electrodes 141 and 142 each having a small thickness.

On the contrary, when the solder 42 is supplied at a low speed, the size of the solder 42 may increase.

The pad 1 may be preheated at a temperature higher than the low melting point metal of the metal connection layer 192. For example, when the low melting point metal of the metal connection layer 192 uses tin (Sn), the pad 1 may be heated up to about 260° C. Namely, a heating temperature of the pad 1 may be set to be higher than a melting point of the low melting point metal of the metal connection layer 192 by about 10° C. to 20° C.

As shown in FIG. 3B, the ultrasonic generator 50 may include a main body 51 generating ultrasonic vibration energy and an ultrasonic tip 52. In the embodiment disclosed herein, an ultrasonic vibration may have a frequency of about 20 Hz to 50 Hz.

When the frequency of the ultrasonic vibration is lower than 20 Hz, a cavitation strength may increase and the size of air particles may increase. Hence, a surface oxide layer SL formed on the surfaces of the first and second electrodes 141 and 142 may be not completely removed.

Further, when the frequency of the ultrasonic vibration is higher than 40 Hz, the cavitation strength may decrease and the size of the air particles may decrease. Hence, not only the surface oxide layer SL formed on the surfaces of the first and second electrodes 141 and 142 but also the surfaces of the first and second electrodes 141 and 142 may be damaged.

Accordingly, when the frequency of the ultrasonic vibration is about 30 Hz to 40 Hz, only the surface oxide layer SL formed on the surfaces of the first and second electrodes 141 and 142 may be completely removed. The embodiment of the invention is not limited thereto.

The ultrasonic vibration energy generates the cavitation and can remove the surface oxide layer SL formed on the surfaces of the first and second electrodes 141 and 142.

A diameter W of the ultrasonic tip 52 may be about 1.0 mm to 1.5 mm.

FIGS. 4A to 5D illustrate a method for manufacturing the solar cell module according to the first embodiment of the invention.

Figure 4A:
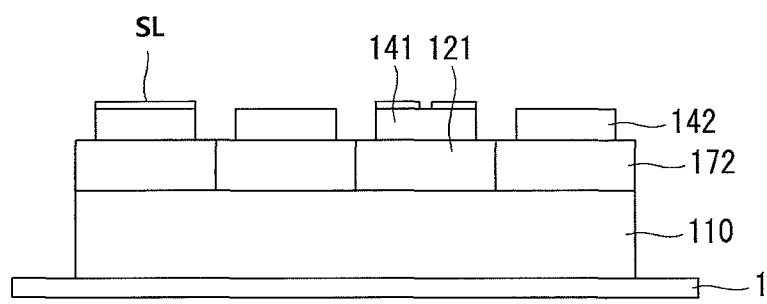
FIGS. 4A to 5D illustrate a method for manufacturing the solar cell module shown in FIG. 1.

As shown in FIG. 4A, the first solar cell C1, in which the first and second electrodes 141 and 142 are alternately positioned on the back surface of the semiconductor substrate 110 and are separated from each other, may be positioned on the pad 1. In this instance, the pad 1 may be preheated at a temperature higher than the metal solder 42 supplied by the solder supply unit 40 by about 10° C. to 20° C.

The textured surface having the plurality of protrusion or having the uneven characteristics may be formed on the front surface of the semiconductor substrate 110.

Impurities (for example, a surface oxide layer SL) produced when the electrode is formed may exist in the surfaces of the first and second electrodes 141 and 142. In the embodiment disclosed herein, the surface oxide layer SL may be formed on the entire surfaces of the first and second electrodes 141 and 142 or a portion of the surface of each of the first and second electrodes 141 and 142.

If the surface oxide layer SL exists in the surfaces of the first and second electrodes 141 and 142, an adhesive strength between the interconnector 160 and the first and second electrodes 141 and 142 may be reduced. Thus, it is preferable, but not required, that surface processing of the first and second electrode's 141 and 142 is performed before the interconnector 160 is attached to the first and second electrodes 141 and 142.

The surface processing of the first and second electrodes 141 and 142 is described in detail later with reference to FIG. 5C.

Figure 4B:
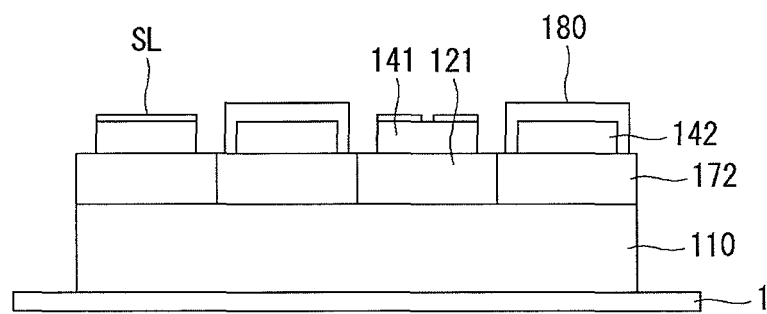

Next, as shown in FIG. 4B, the insulating layer 180 surrounding the first electrode 141 or the second electrode 142 may be formed. In this instance, the insulating layer 180 may insulate the interconnector 160 from the first electrode 141 or the second electrode 142 at a crossing of the interconnector 160 and the first electrode 141 or the second electrode 142. The insulating layer 180 may be formed of an insulating resin, for example, epoxy.

Next, after the surface processing of the first and second electrodes 141 and 142 is performed using the ultrasonic soldering device 2, the metal connection layer 192 may be formed.

Figure 5A:
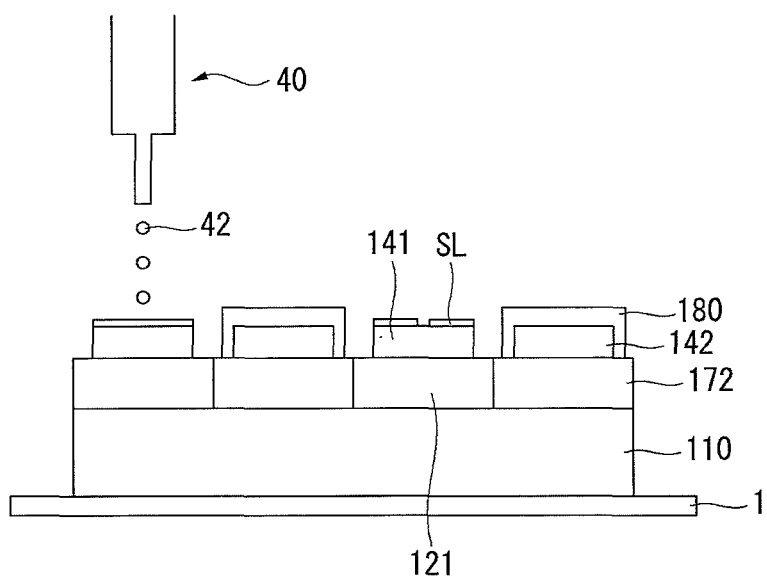

More specifically, as shown in FIG. 5A, the solder supply unit 40 may apply a metal solder 42 of a solid state to the first electrode 141 or the second electrode 142 and the insulating layer 180 in the first direction x. In the embodiment disclosed herein, the metal solder 42 may be formed of a low melting point metal.

Namely, the metal solder 42 may be applied on the first electrode 141 or the second electrode 142 in the first direction x and may be applied on the insulating layer 180 in the first direction x.

Figure 5B:
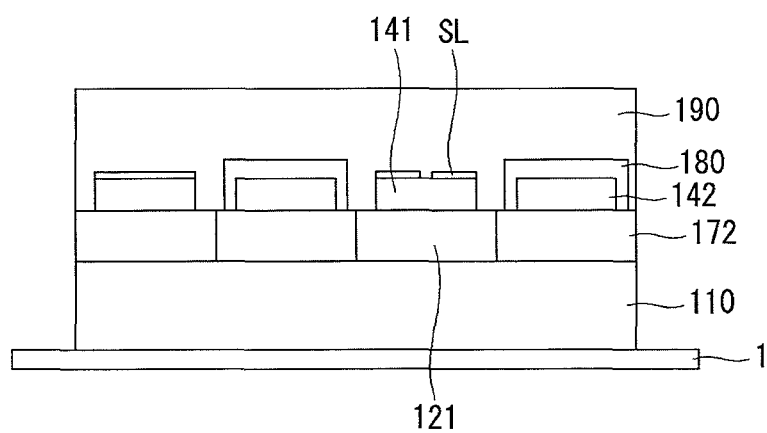

Next, as shown in FIG. 5B, the metal solder 42 applied on the first electrode 141 or the second electrode 142 and the insulating layer 180 may be melted to form a contact layer 190. In this instance, because a preheating temperature of the pad 1 is set to be higher than a melting point of the low melting point metal of the metal solder 42 by about 10° C. to 20° C., the metal solder 42 may be easily melted.

Figure 5C:
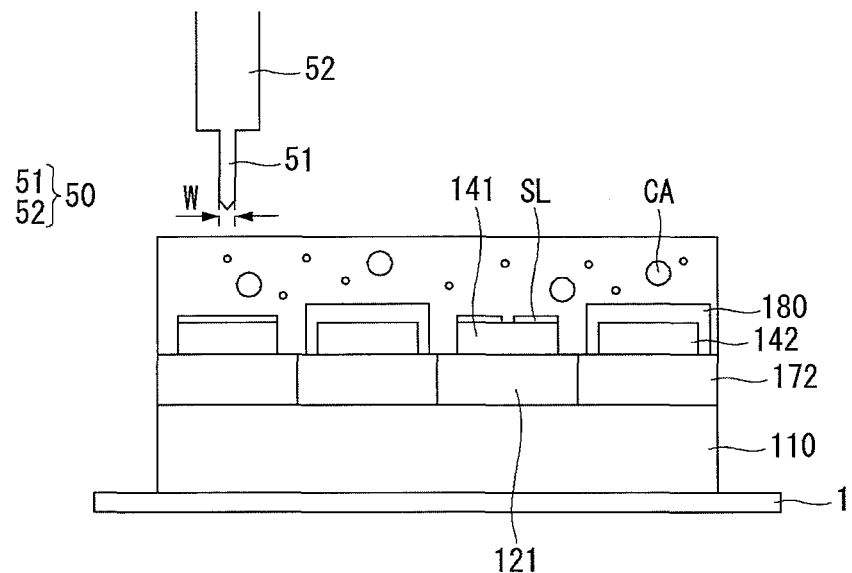

Next, as shown in FIG. 5C, an ultrasonic vibration may be generated in the contact layer 190 using the ultrasonic generator 50. Hence, a cavitation phenomenon CA may be generated in the contact layer 190 and thus may remove the surface oxide layer SL formed on the surfaces of the first and second electrodes 141 and 142.

The cavitation phenomenon is a method for producing air bubbles using ultrasonic cavitation and removing the surface oxide layer SL on the surfaces of the first and second electrodes 141 and 142 using energy of a shock wave bursting the air bubbles.

A related art generally used flux to efficiently remove an oxide layer on the surface of metal. The flux includes rosin, a fluidity additive, a solvent, an activator (for example, halogen such as fluorine (F), chlorine (Cl), bromine (Br)), and the like. The related art applied the flux to the surface of the oxide layer and then removed the oxide layer blocking the soldering through a firing process.

However, the embodiment of the invention can remove the oxide layer using the cavitation phenomenon without the flux and can uniformly maintain an adhesive strength between the interconnector 160 and the first and second electrodes 141 and 142 using the metal connection layer 192.

When the oxide layer is removed using the flux as in the related art, a process for removing a material (for example, rosin) remaining in the surface of metal after the removal of the oxide layer is additionally necessary. Further, the surface of metal may be damaged during the process for removing the material. Thus, the method for removing the oxide layer on the surface of metal using the flux may increase the number of processes and lead to a reduction in productivity and an increase in the manufacturing cost.

Figure 5D:
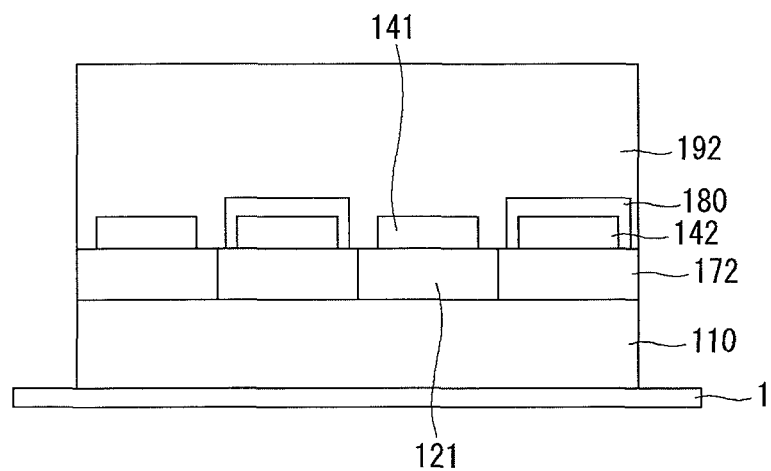

Next, as shown in FIG. 5D, the surface of at least one of the first and second electrodes 141 and 142, on which the surface oxide layer SL is removed, and the contact layer 190 may be melted to form the metal connection layer 192 on the surfaces of the first and second electrodes 141 and 142.

Next, the interconnector 160 is positioned on the metal connection layer 192 and may be electrically connected to the first and second electrodes 141 and 142.

More specifically, before the metal connection layer 192 is bonded to the interconnector 160, a pre-bonding process for fixing the interconnector 160 and a final-bonding process for finally bonding the metal connection layer 192 to the interconnector 160 may be preformed.

For example, in the pre-bonding process, the interconnector 160 may be temporarily fixed using a tape. In the final-bonding process, a temperature for curing the metal connection layer 192 or the coating layer 164 of the interconnector 160 may be set to 140° C. to 180° C., for example.

The low melting point metal of the metal connection layer 192 and the low melting point metal of the coating layer 164 of the interconnector 160 may be melted and easily connected. When the low melting point metal of the metal connection layer 192 and the low melting point metal of the coating layer 164 are formed of the same material, a coupling strength between the interconnector 160 and the metal connection layer 192 may be improved and a contact resistance therebetween may be minimized. Hence, the efficiency of the solar cell may be maximized.

Hereinafter, a solar cell module according to a second embodiment of the invention is described with reference to FIGS. 6 and 7.

Figure 6A:
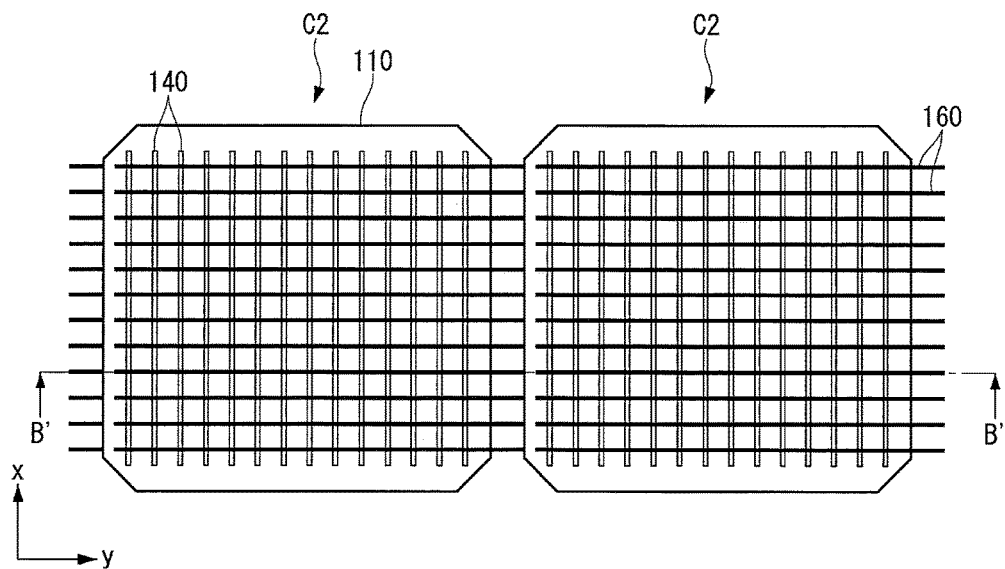
FIG. 6A illustrates a shape of a solar cell module according to an example embodiment of the invention when viewed from a front surface.
Figure 6B:
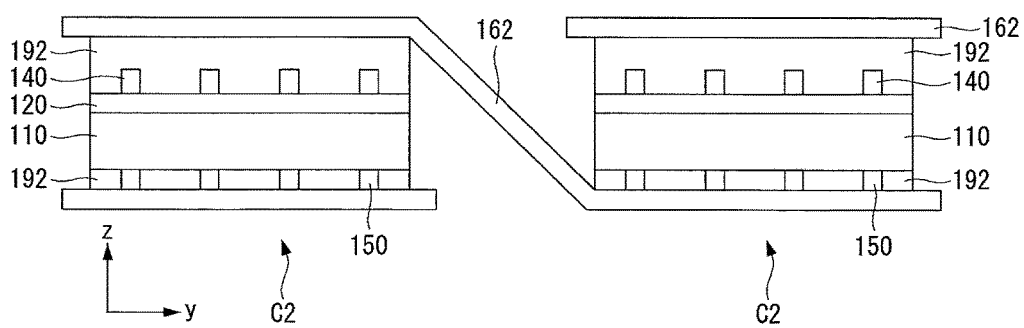
FIG. 6B is a cross-sectional view taken along line B'-B' of FIG. 6A.
Figure 7A:
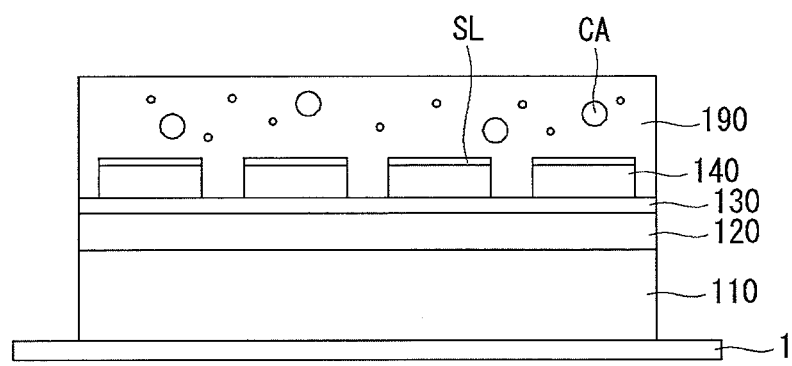
FIGS. 7A and 7B illustrate a method for manufacturing the solar cell module shown in FIG. 6.
Figure 7B:
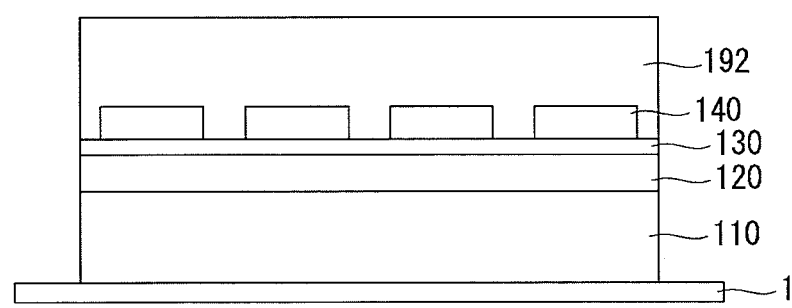

FIG. 6A illustrates a shape of a solar cell module according to the embodiment of the invention when viewed from a front surface, and FIG. 6B is a cross-sectional view taken along line B'-B' of FIG. 6A. FIGS. 7A and 7B illustrate a method for manufacturing the solar cell module shown in FIG. 6.

A second solar cell C2 according to the second embodiment of the invention is a bifacial solar cell, that receives light from the outside through a front surface and a back surface of a semiconductor substrate 110. Hence, first electrodes 140 may be formed on the front surface of the semiconductor substrate 110, and second electrodes 150 may be formed on the back surface of the semiconductor substrate 110.

Referring to FIGS. 6A and 6B, each of a plurality of interconnectors 162 in the solar cell module according to the second embodiment of the invention may extend in a second direction y and may connect the first electrodes 140 of the second solar cell C2 to second electrodes 150 of another second solar cell C2 in series.

A metal connection layer 192 may be formed on a portion of an emitter region 120 except a formation area of the first electrodes 140 and may directly contact the emitter region 120.

Referring to FIG. 7A, a cavitation phenomenon may be generated in a contact layer 190 using the ultrasonic generator 50.

Referring to FIG. 7B, a surface oxide layer SL formed on the surface of the first electrode 140 may be removed through the cavitation phenomenon. Hence, the metal connection layer 192 may be formed.

Various configurations may be applied to the solar cell applicable to the solar cell module according to the second embodiment of the invention.

Figure 8A:
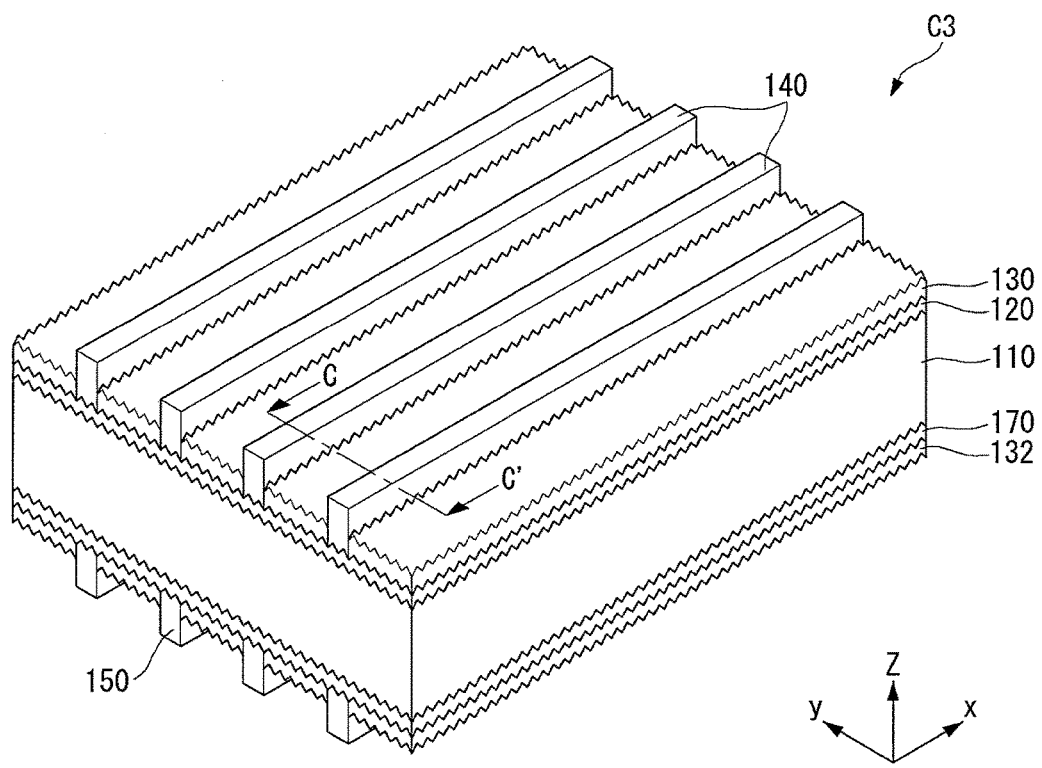
FIG. 8A shows another example of a solar cell shown in FIG. 6A.
Figure 8B:
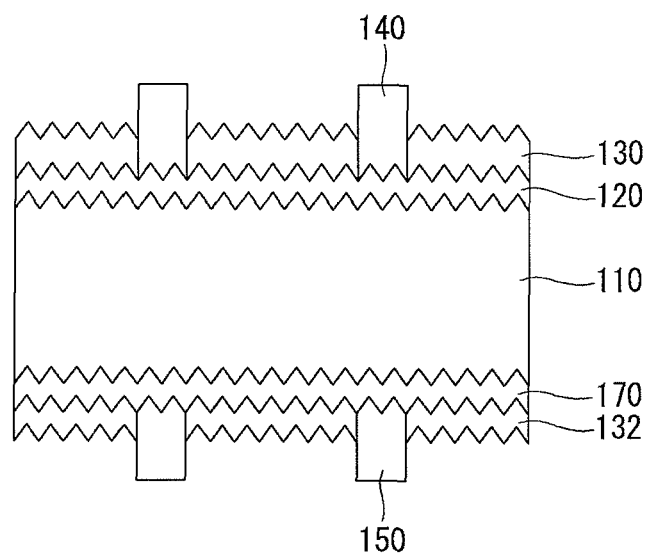
FIG. 8B is a cross-sectional view taken along line C'-C' of FIG. 8A.

FIG. 8A shows another example of the solar cell shown in FIG. 6A, and FIG. 8B is a cross-sectional view taken along line C'-C' of FIG. 8A.

As shown in FIGS. 8A and 8B, a third solar cell C3 according to a third embodiment of the invention may include a semiconductor substrate 110, an emitter region 120, a first anti-reflection layer 130, a plurality of first electrodes 140, a back surface field (BSF) region 170, a second anti-reflection layer 132, and a plurality of second electrodes 150.

The third solar cell C3 according to the third embodiment of the invention is a bifacial solar cell, that receives light from the outside through a first surface and a second surface of the semiconductor substrate 110, and can produce electric current using light incident on the first surface and the second surface of the semiconductor substrate 110.

The back surface field region 170 may be omitted, if necessary or desired. In the following description, the embodiment of the invention describes the solar cell including the back surface field region 170 as an example because the back surface field region 170 further improves efficiency of the solar cell.

The semiconductor substrate 110 includes the first surface (hereinafter, referred to as "front surface") and the second surface (hereinafter, referred to as "back surface"), and the front surface and the back surface are positioned opposite each other.

The semiconductor substrate 110 may be formed of silicon of a first conductive type, for example, an n-type, though not required. Silicon used in the semiconductor substrate 110 may be single crystal silicon, polycrystalline silicon, or amorphous silicon. For example, the semiconductor substrate 110 may be formed of a crystalline silicon wafer.

When the semiconductor substrate 110 is of the n-type, the semiconductor substrate 110 may be doped with impurities of a group V element, such as phosphorus (P), arsenic (As), and antimony (Sb). Alternatively, the semiconductor substrate 110 may be of a p-type. If the semiconductor substrate 110 is of the p-type, the semiconductor substrate 110 may be doped with impurities of a group III element, such as boron (B), gallium (Ga), and indium (In).

At least one of the front surface and the back surface of the semiconductor substrate 110 may have a plurality of uneven portions, so as to increase an absorptance of light by reducing a reflectance of light at the front surface and the back surface of the semiconductor substrate 110. FIGS. 8A and 8B show that only an edge of the semiconductor substrate 110 has the uneven portions for the sake of brevity and ease of reading. Thus, FIGS. 8A and 8B show that only an edge of the emitter region 120 positioned on the front surface of the semiconductor substrate 110 has the uneven portions. However, in fact, the entire front surface of the semiconductor substrate 110 has the uneven portions, and the entire surface of the emitter region 120 positioned on the front surface of the semiconductor substrate 110 has the uneven portions.

Light incident on the front surface of the semiconductor substrate 110 having the plurality of uneven portions is reflected several times by the uneven portions of the emitter region 120 and the uneven portions of the semiconductor substrate 110 and is incident inside the semiconductor substrate 110. Hence, an amount of light reflected from the front surface of the semiconductor substrate 110 decreases, and an amount of light incident inside the semiconductor substrate 110 increases. Further, surface areas of the semiconductor substrate 110 and the emitter region 120, on which light is incident, increase by the uneven portions, and an amount of light incident on the semiconductor substrate 110 increases.

As shown in FIGS. 8A and 8B, the emitter region 120 is formed at the front surface of the semiconductor substrate 110 of the first conductive type and is a region formed by doping the semiconductor substrate 110 with impurities of a second conductive type (for example, p-type) opposite the first conductive type (for example, n-type). Namely, the emitter region 120 may be positioned inside the front surface of the semiconductor substrate 110. Thus, the emitter region 120 of the second conductive type forms a p-n junction along with a first conductive type region of the semiconductor substrate 110.

Carriers, i.e., electron-hole pairs produced by light incident on the semiconductor substrate 110 are separated into electrons and holes by the p-n junction between the semiconductor substrate 110 and the emitter region 120. Then, the separated electrons may move to the n-type semiconductor, and the separated holes may move to the p-type semiconductor. Thus, when the semiconductor substrate 110 is of the n-type and the emitter region 120 is of the p-type, the separated electrons may move to the semiconductor substrate 110, and the separated holes may move to the emitter region 120.

Because the emitter region 120 forms the p-n junction along with the semiconductor substrate 110, i.e., the first conductive type region of the semiconductor substrate 110, the emitter region 120 may be of the n-type when the semiconductor substrate 110 is of the p-type unlike the embodiment described above. In this instance, the separated holes may move to the back surface of the semiconductor substrate 110, and the separated electrons may move to the emitter region 120.

Returning to the embodiment of the invention, when the emitter region 120 is of the p-type, the emitter region 120 may be formed by doping the semiconductor substrate 110 with impurities of a group III element, such as B, Ga, and In. On the contrary, when the emitter region 120 is of the n-type, the emitter region 120 may be formed by doping the semiconductor substrate 110 with impurities of a group V element, such as P, As, and Sb.

As shown in FIGS. 8A and 8B, the first anti-reflection layer 130 is positioned on the front surface of the semiconductor substrate 110. When the emitter region 120 is positioned on the front surface of the semiconductor substrate 110, the first anti-reflection layer 130 may be positioned on the emitter region 120.

The first anti-reflection layer 130 may be formed of at least one of aluminum oxide (AlOx), silicon nitride (SiNx), silicon oxide (SiOx), and silicon oxynitride (SiOxNy). The first anti-reflection layer 130 reduces a reflectance of light incident on the third solar cell C3 and increases selectivity of a predetermined wavelength band, thereby increasing the efficiency of the third solar cell C3.

When the semiconductor substrate 110 has the uneven portions, the first anti-reflection layer 130 includes an uneven surface having a plurality of uneven portions similar to the semiconductor substrate 110.

In the embodiment of the invention, the first anti-reflection layer 130 has a single-layered structure. However, the first anti-reflection layer 130 may have a multi-layered structure, for example, a double-layered structure. In this instance, a passivation function of the first anti-reflection layer 130 may be further strengthened, and photoelectric efficiency of the third solar cell C3 may be further improved. The first anti-reflection layer 130 may be omitted, if necessary or desired.

The first anti-reflection layer 130 may be formed on the front surface of the semiconductor substrate 110 using a chemical vapor deposition (CVD) method, such as a plasma enhanced chemical vapor deposition (PECVD) method.

As shown in FIGS. 8A and 8B, the plurality of first electrodes 140 are positioned on the front surface of the semiconductor substrate 110 and are separated from one another. Each first electrode 140 may extend in the first direction x. The electrodes, which are separated from one another on the front surface of the semiconductor substrate 110 and extend in the first direction x, may be referred to as front fingers.

The plurality of first electrodes 140 may pass through the first anti-reflection layer 130 and may be connected to the emitter region 120 positioned on the front surface of the semiconductor substrate 110. Namely, the first electrodes 140 may be positioned on the emitter region 120, on which the first anti-reflection layer 130 is not positioned.

The plurality of first electrodes 140 may be formed of at least one conductive material, for example, tin (Sn) and may collect carriers (for example, holes) moving to the emitter region 120.

In the embodiment of the invention, the plurality of first electrodes 140 may be formed through a soldering process using ultrasonic vibration.

More specifically, when the first electrodes 140 are formed using the ultrasonic vibration, ultrasonic vibration energy may generate cavitation by generating the ultrasonic vibration in a low melting point solder applied on the front surface of the semiconductor substrate 110, thereby partially etching the first anti-reflection layer 130. Hence, the first electrodes 140 may pass through the first anti-reflection layer 130 and may be connected to the emitter region 120 positioned on the front surface of the semiconductor substrate 110.

The first electrodes 140 may be formed of the low melting point solder having a melting point equal to or lower than about 150° C. and may be formed of at least one conductive material of Sn—Bi or Sn—In.

In the embodiment of the invention, an amount of tin (Sn) included in the low melting point solder may be about 10 wt % to 60 wt %.

As shown in FIGS. 8A and 8B, the back surface field region 170 may be positioned at the back surface opposite the front surface of the semiconductor substrate 110. The back surface field region 170 is a region (for example, an n+-type region) which is more heavily doped than the semiconductor substrate 110 with impurities of the same conductive type as the semiconductor substrate 110.

A potential barrier is formed by a difference between impurity concentrations of the first conductive type region of the semiconductor substrate 110 and the back surface field region 170. The potential barrier prevents or reduces holes from moving to the back surface field region 170 used as a moving path of electrons and makes it easier for electrons to move to the back surface field region 170. Thus, the back surface field region 170 reduces an amount of carriers lost by a recombination and/or a disappearance of electrons and holes at and around the back surface of the semiconductor substrate 110 and accelerates a movement of desired carriers (for example, electrons), thereby increasing the movement of carriers to the second electrodes 150.

As shown in FIGS. 8A and 8B, the second anti-reflection layer 132 may be positioned on the back surface opposite the front surface of the semiconductor substrate 110. When the back surface field region 170 is positioned at the back surface of the semiconductor substrate 110, the second anti-reflection layer 132 may be positioned on the back surface field region 170. In this instance, the second anti-reflection layer 132 may minimize the reflection of light incident on the back surface of the semiconductor substrate 110.

The second anti-reflection layer 132 may be formed of at least one of aluminum oxide (AlOx), silicon nitride (SiNx), silicon oxide (SiOx), and silicon oxynitride (SiOxNy). The first anti-reflection layer 130 and the second anti-reflection layer 132 may be formed of the same material or different materials.

Further, the first anti-reflection layer 130 and the second anti-reflection layer 132 may be formed using the same method or different methods.

A passivation layer may be formed between the first anti-reflection layer 130 and the emitter region 120 and between the second anti-reflection layer 132 and the back surface field region 170. The passivation layer may be formed of non-crystalline semiconductor. For example, the passivation layer may be formed of intrinsic hydrogenated amorphous silicon (i-a-Si:H). The passivation layer may perform a passivation function, which converts a defect, for example, dangling bonds existing at and around the surface of the semiconductor substrate 110 into stable bonds using hydrogen (H) contained in the passivation layer and prevents or reduces a recombination and/or a disappearance of carriers moving to the surface of the semiconductor substrate 110. Thus, the passivation layer reduces an amount of carriers lost by the defect at and around the surface of the semiconductor substrate 110. Hence, the passivation layer positioned on the front surface and the back surface of the semiconductor substrate 110 reduces an amount of carriers lost by the defect at and around the surface of the semiconductor substrate 110, thereby improving the efficiency of the solar cell.

As shown in FIGS. 8A and 8B, the plurality of second electrodes 150 are positioned on the back surface of the semiconductor substrate 110 and are separated from one another. Each second electrode 150 may extend in the first direction x. The electrodes, which are separated from one another on the back surface of the semiconductor substrate 110 and extend in the first direction x, may be referred to as back fingers. The second electrodes 150 may be positioned opposite the first electrodes 140 at a location corresponding to the first electrodes 140 with the semiconductor substrate 110 interposed therebetween. Hence, the number of second electrodes 150 may be the same as the number of first electrodes 140. The embodiment of the invention is not limited thereto.

The plurality of second electrodes 150 may pass through the second anti-reflection layer 132 and may be connected to the back surface field region 170 positioned on the back surface of the semiconductor substrate 110. Namely, the second electrodes 150 may be positioned on the back surface field region 170, on which the second anti-reflection layer 132 is not positioned.

The plurality of second electrodes 150 may be formed of at least one conductive material, for example, tin (Sn) and may collect carriers (for example, holes) moving to the back surface field region 170.

In the embodiment of the invention, the second electrodes 150 may be formed through the soldering process using the ultrasonic vibration in the same manner as the first electrodes 140.

More specifically, when the second electrodes 150 are formed using the ultrasonic vibration, ultrasonic vibration energy may generate cavitation by generating the ultrasonic vibration in a high melting point solder applied on the back surface of the semiconductor substrate 110, thereby partially etching the second anti-reflection layer 132. Hence, the second electrodes 150 may pass through the second anti-reflection layer 132 and may be connected to the back surface field region 170 positioned on the back surface of the semiconductor substrate 110.

The second electrodes 150 may be formed of the high melting point solder having a melting point equal to or higher than about 150° C. and may be formed of at least one conductive material of Sn—Ag—Cu, Sn—Zn, or Sn—Pb.

In the embodiment of the invention, an amount of tin (Sn) included in the high melting point solder may be about 60 wt % to 100 wt %.

The second electrodes 150 may be formed earlier than the first electrodes 140.

In the related art, the first electrodes 140 and the second electrodes 150 were simultaneously formed, or the second electrodes 150 were formed after the first electrodes 140 were formed.

However, in the embodiment of the invention, it may be preferable, but not required, that after the second electrodes 150 formed of the high melting point solder having the melting point equal to or higher than about 150° C. are formed, the first electrodes 140 formed of the low melting point solder having the melting point equal to or lower than about 150° C. are formed.

More specifically, when the first and second electrodes are simultaneously formed, the low melting point solder included in the first electrode may be damaged or deteriorated by heat applied when a tabbing process is performed because the melting point of the second electrode is higher than the melting point of the first electrode. For example, because the tabbing process is performed at about 150° C. to 180° C., the second electrode formed of the high melting point solder having the melting point equal to or higher than about 150° C. is not affected by heat. However, the first electrode formed of the low melting point solder having the melting point equal to or lower than about 150° C. is affected by heat.

Alternatively, when the first electrode is formed earlier than the second electrode, the low melting point solder included in the first electrode formed of the low melting point solder having the melting point equal to or lower than about 150° C. may be damaged or deteriorated by heat applied when the second electrode formed of the high melting point solder having the melting point equal to or higher than about 150° C. is formed. Namely, the first electrode may be bowed or twisted, and thus a physical deformation of the first electrode may be caused.

However, when the second electrode formed of the high melting point solder having the melting point equal to or higher than about 150° C. is formed earlier than the first electrode formed of the low melting point solder having the melting point equal to or lower than about 150° C., the first electrode is not damaged or deteriorated by heat because the melting point of the first electrode is lower than the melting point of the second electrode.

Accordingly, in the embodiment of the invention, it is preferable, but not required, that the first electrodes are formed after the second electrodes are formed.

In the bifacial solar cell, because an amount of light incident on the front surface of the semiconductor substrate 110 is more than an amount of light incident on the back surface of the semiconductor substrate 110, the number of second electrodes formed on the back surface of the semiconductor substrate 110 may be more than the number of first electrodes formed on the front surface of the semiconductor substrate 110. In this instance, referring to FIG. 11, in a fourth solar cell C4 according to a fourth embodiment of the invention, a distance (i.e., a pitch) between second electrodes 150 may be less than a distance between first electrodes 140.

In the bifacial solace cell having the above-described configuration, when light irradiated onto the third solar cell C3 is incident on the semiconductor substrate 110 through the emitter region 120 and the back surface field region 170, a plurality of electron-hole pairs are generated in the semiconductor substrate 110 by light energy produced based on the incident light. In this instance, because the front surface and the back surface of the semiconductor substrate 110 are the textured surface, a light reflectance at the front surface and the back surface of the semiconductor substrate 110 is reduced. Further, because both incident and reflective operations are performed at the textured surfaces of the semiconductor substrate 110, the light is confined in the third solar cell C3. As a result, an absorptance of light increase, and the efficiency of the bifacial solace cell, i.e., the third solar cell C3, is improved.

In addition, because a reflection loss of light incident on the semiconductor substrate 110 is reduced by the first anti-reflection layer 130 and the second anti-reflection layer 132, an amount of light incident on the semiconductor substrate 110 further increases.

The electron-hole pairs are separated into electrons and holes due to the p-n junction between the semiconductor substrate 110 and the emitter region 120. Then, the separated electrons move to the back surface of the n-type semiconductor substrate 110, and the separated holes move to the p-type emitter region 120. In this instance, the semiconductor substrate 110 may be of the n-type and the emitter region 120 may be of the p-type.

The electrons moving to the semiconductor substrate 110 move to the second electrodes 150 through the back surface field region 170, and the holes moving to the emitter region 120 move to the first electrodes 140. When the first and second electrodes 140 and 150 are connected to each other using electric wires, current flows therein to thereby enable use of the current for electric power.

FIGS. 9A to 9E sequentially illustrate a method for manufacturing the third solar cell C3 shown in FIG. 8A.

A method for manufacturing the third solar cell C3 according to the third embodiment of the invention is described below with reference to FIGS. 9A to 9E.

Figure 9A:
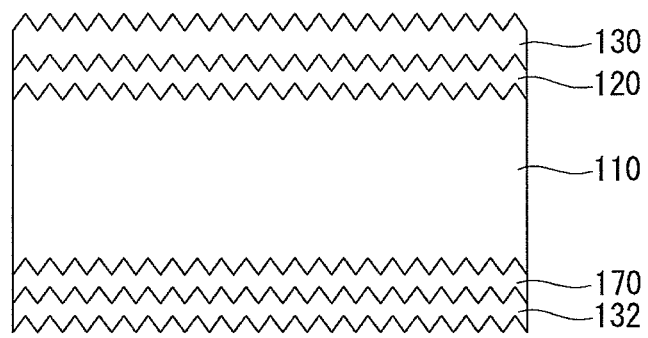
FIGS. 9A to 9E sequentially illustrate a method for manufacturing the solar cell shown in FIG. 8A.

As shown in FIG. 9A, the front surface and the back surface of the semiconductor substrate 110 are formed as the textured surface. The emitter region 120 is formed on the front surface of the semiconductor substrate 110, and the back surface field region 170 is formed on the back surface of the semiconductor substrate 110.

More specifically, a high temperature thermal process of a material (for example, $B_2H_6$) containing impurities of a group III element, such as boron (B), gallium (Ga), and indium (In), is performed on the n-type semiconductor substrate 110 to diffuse the impurities of the group III element into the semiconductor substrate 110. Hence, the p-type emitter region 120 is formed at the entire surface of the semiconductor substrate 110.

If the semiconductor substrate 110 is of the p-type in another embodiment of the invention, a high temperature thermal process of a material (for example, $POCl_3$ or $H_3PO_4$) containing impurities of a group V element, such as phosphorus (P), arsenic (As), and antimony (Sb), may be performed on the semiconductor substrate 110 to diffuse the impurities of the group V element into the semiconductor substrate 110. Hence, the n-type emitter region 120 may be formed at the entire surface of the semiconductor substrate 110.

Subsequently, phosphorous silicate glass (PSG) containing phosphor (P) or boron silicate glass (BSG) containing boron (B) produced when n-type impurities or p-type impurities are diffused into the semiconductor substrate 110 is removed through an etching process.

In this instance, each of the front surface and the back surface of the semiconductor substrate 110 are formed as the textured surface using a wet etching process or a dry etching process using plasma. Hence, the emitter region 120 has the uneven surface due to the shape of the textured surface of the semiconductor substrate 110.

Next, the back surface field region 170 is formed at the back surface of the semiconductor substrate 110 using a thermal diffusion method.

More specifically, the thermal diffusion method may pre-deposit a material (for example, $BBr_3$) containing impurities of a group III element, such as boron (B), gallium (Ga), and indium (In), on the semiconductor substrate 110 and may diffuse the pre-deposited impurities of the group III element into the semiconductor substrate 110 to form the back surface field region 170.

Figure 12:
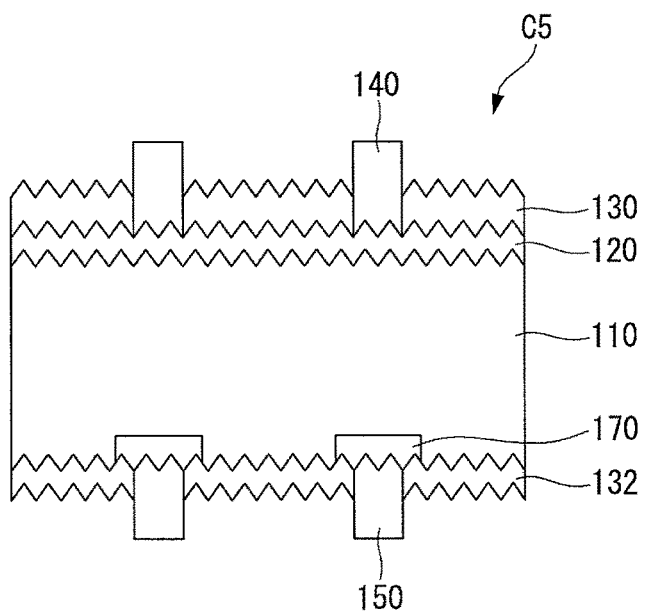

The back surface field region 170 may be formed at the entire back surface of the semiconductor substrate 110 as shown in FIGS. 8A and 8B. Alternatively, the back surface field region 170 may be locally formed at a location corresponding to the second electrodes 150 at the back surface of the semiconductor substrate 110. For example, as shown in FIG. 12, in a fifth solar cell C5 according to a fifth embodiment of the invention, a back surface field region 170 may be locally formed at a location corresponding to second electrodes 150 at a back surface of a semiconductor substrate 110 by depositing and diffusing impurities of a group III element.

The emitter region 120 and the back surface field region 170 may be formed through a process using laser doping, a process using laser patterning and laser doping, a process using an anti-diffusion layer, and the like.

Next, the first anti-reflection layer 130 and the second anti-reflection layer 132 are respectively formed on the front surface and the back surface of the semiconductor substrate 110 using various layer formation methods, for example, the PECVD method. The first anti-reflection layer 130 and the second anti-reflection layer 132 may be formed of the same material or different materials. The first anti-reflection layer 130 and the second anti-reflection layer 132 may have a single-layered structure or a multi-layered structure and may be formed using the same method or different methods.

A passivation layer may be formed between the first anti-reflection layer 130 and the emitter region 120 and between the second anti-reflection layer 132 and the back surface field region 170.

Next, the third solar cell C3, in which the first anti-reflection layer 130 and the second anti-reflection layer 132 are respectively formed on the front surface and the back surface of the semiconductor substrate 110, is positioned on the pad 1. In this instance, the pad 1 may be preheated at a temperature higher than a solder, which will be applied on the front surface and the back surface of the third solar cell C3, by about 10° C. to 20° C.

Figure 9B:
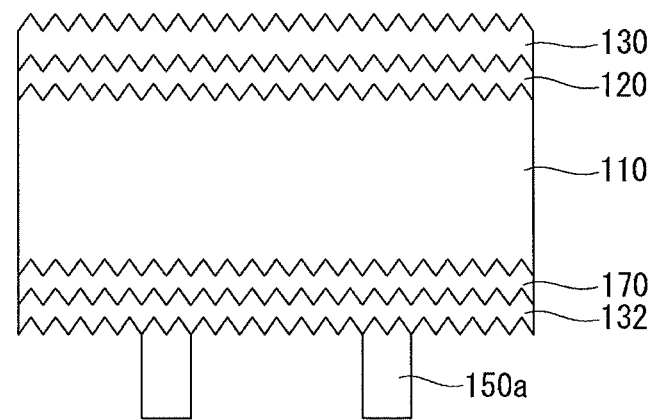
Figure 9C:
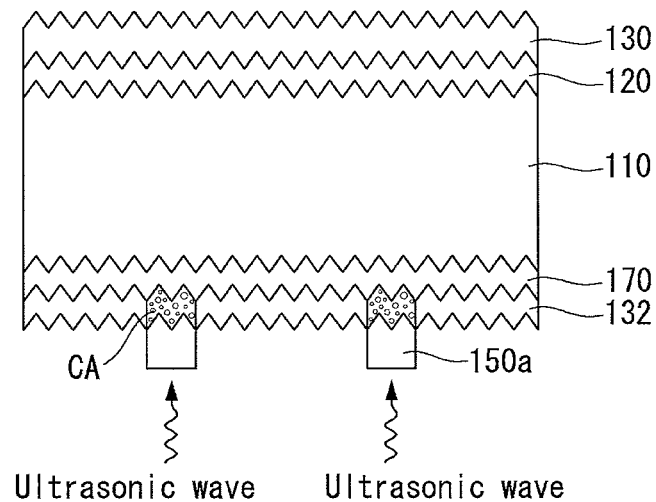

Next, as shown in FIG. 9B, a second metal solder 150a may be applied on the back surface of the semiconductor substrate 110 in the first direction x. In this instance, the second metal solder 150a may be a liquid state of a high melting point metal having a melting point equal to or higher than about 150° C. The second metal solder 150a may be formed of at least one conductive material of Sn—Ag—Cu, Sn—Zn, or Sn—Pb. The conductive material may be a high melting point solder, and an amount of tin (Sn) included in the high melting point solder may be about 60 wt % to 100 wt %. In embodiments of the invention, reference to a high melting point metal may also refer to a metal having a melting point that is higher than that of a low melting point metal, and vice versa Next, as shown in FIG. 9C, ultrasonic vibration is generated in the second metal solder 150a to form the second electrodes 150.

More specifically, ultrasonic vibration energy may generate cavitation CA and may remove a portion of the second anti-reflection layer 132, on which the second metal solder 150a is applied.

A cavitation phenomenon is a method for producing air bubbles using ultrasonic cavitation and removing the portion of the second anti-reflection layer 132, on which the second metal solder 150a is applied, using energy of a shock wave bursting the air bubbles.

In the related art, an electrode paste was printed using a screen printing method and then was dried at 120° C. to 200° C. to form an electrode pattern. Subsequently, the electrode pattern was fired at 750° C. to 800° C. to form the electrode.

However, in the embodiment of the invention, because the portion of the second anti-reflection layer 132, on which the second metal solder 150a is applied, is removed using the cavitation phenomenon, a firing process may be omitted. Furthermore, because the second metal solder 150a is formed of tin (Sn), the manufacturing cost may be further reduced. Thus, the efficiency of the solar cell may be further improved because the simplification of the process and a reduction in the manufacturing cost are achieved without a reduction in an adhesive strength between the back surface field region 170 and the electrode.

In the embodiment disclosed herein, an ultrasonic vibration may have a frequency of about 20 Hz to 50 Hz.

When the frequency of the ultrasonic vibration is lower than 20 Hz, a cavitation strength may increase and the size of air particles may increase. Hence, the portion of the second anti-reflection layer 132, on which the second metal solder 150a is applied, may be not completely removed.

Further, when the frequency of the ultrasonic vibration is higher than 40 Hz, the cavitation strength may decrease and the size of the air particles may decrease. Hence, not only the second anti-reflection layer 132 but also the back surface field region 170 or the surface of the semiconductor substrate 110 may be damaged.

Accordingly, when the frequency of the ultrasonic vibration is about 30 Hz to 40 Hz, only the portion of the second anti-reflection layer 132, on which the second metal solder 150a is applied, may be completely removed. The embodiment of the invention is not limited thereto. An example where only the portion of the second anti-reflection layer 132, on which the second metal solder 150a is applied, is not completely removed is described with reference to FIGS. 10A and 10B.

Figure 9D:
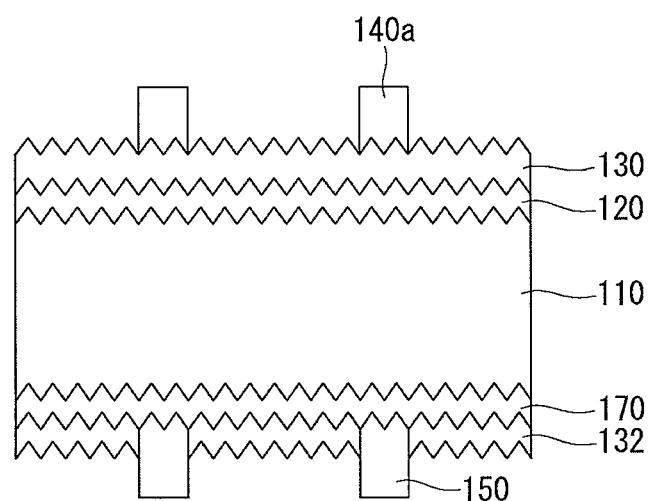

Next, as shown in FIG. 9D, a first metal solder 140a may be applied on the front surface of the semiconductor substrate 110 in the first direction x. In this instance, the first metal solder 140a may be a liquid state of a low melting point metal having a melting point equal to or lower than about 150° C. The first metal solder 140a may be formed of at least one conductive material of Sn—Bi and Sn—In. The conductive material may be a low melting point solder, and an amount of tin (Sn) included in the low melting point solder may be about 10 wt % to 60 wt %.

Figure 9E:
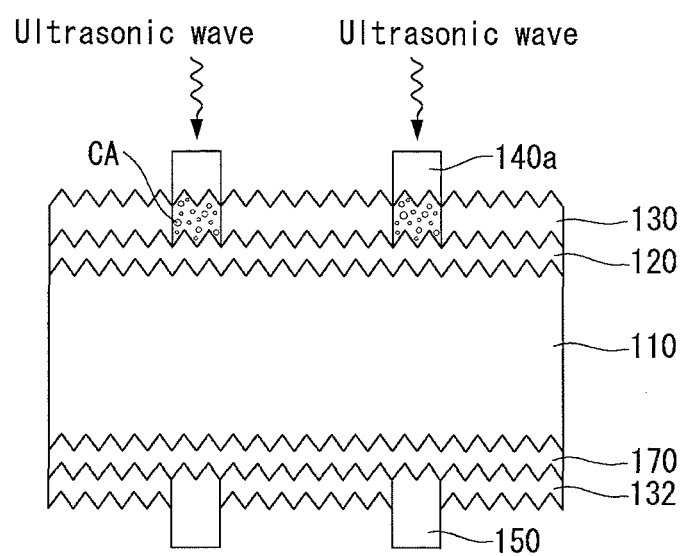

Next, as shown in FIG. 9E, ultrasonic vibration is generated in the first metal solder 140a to form the first electrodes 140.

More specifically, ultrasonic vibration energy may generate cavitation CA and may remove a portion of the first anti-reflection layer 130, on which the first metal solder 140a is applied.

A cavitation phenomenon is a method for producing air bubbles using ultrasonic cavitation and removing the portion of the first anti-reflection layer 130, on which the first metal solder 140a is applied, using energy of a shock wave bursting the air bubbles.

In the related art, an electrode paste was printed using a screen printing method and then was dried at 120° C. to 200° C. to form an electrode pattern. Subsequently, the electrode pattern was fired at 750° C. to 800° C. to form the electrode.

However, in the embodiment of the invention, because the portion of the first anti-reflection layer 130, on which the first metal solder 140a is applied, is removed using the cavitation phenomenon, a firing process may be omitted. Furthermore, because the first metal solder 140a is formed of tin (Sn), the manufacturing cost may be further reduced. Thus, the efficiency of the solar cell may be further improved because the simplification of the process and a reduction in the manufacturing cost are achieved without a reduction in an adhesive strength between the emitter region 120 and the electrode.

In the embodiment disclosed herein, an ultrasonic vibration may have a frequency of about 20 Hz to 50 Hz.

When the frequency of the ultrasonic vibration is lower than 20 Hz, a cavitation strength may increase and the size of air particles may increase. Hence, the portion of the first anti-reflection layer 130, on which the first metal solder 140a is applied, may be not completely removed.

Further, when the frequency of the ultrasonic vibration is higher than 40 Hz, the cavitation strength may decrease and the size of the air particles may decrease. Hence, not only the first anti-reflection layer 130 but also the emitter region 120 or the surface of the semiconductor substrate 110 may be damaged.

Accordingly, when the frequency of the ultrasonic vibration is about 30 Hz to 40 Hz, only the portion of the first anti-reflection layer 130, on which the first metal solder 140a is applied, may be completely removed. The embodiment of the invention is not limited thereto.

As described above, because the second electrode 150 formed of the high melting point solder is formed on the back surface of the semiconductor substrate 110 earlier than the first electrode 140, the second electrode 150 is not physically affected during the formation of the first electrode 140 formed of the low melting point solder. On the other hand, when the first electrode 140 is formed earlier than the second electrode 150, the first electrode 140 may be bowed or twisted because the melting point of the second electrode 150 is higher than the melting point of the first electrode 140. Hence, a physical deformation of the first electrode 140 may be caused.

Accordingly, in the embodiment of the invention, it is preferable, but not required, that the first electrode 140 is formed after the second electrode 150 is formed.

Unlike the embodiment of the invention, a front electrode formed of the high melting point solder may be formed on the front surface of the semiconductor substrate, and a back electrode formed of the low melting point solder may be formed on the back surface of the semiconductor substrate.

Because the front electrode includes the high melting point solder, the front electrode may be formed earlier than the back electrode formed of the low melting point solder.

As described above, because the front electrode formed of the high melting point solder is formed on the front surface of the semiconductor substrate earlier than the back electrode, the front electrode is not physically affected during the formation of the back electrode formed of the low melting point solder. On the other hand, when the back electrode including the low melting point solder is formed earlier than the front electrode including the high melting point solder, the back electrode may be bowed or twisted because the melting point of the front electrode is higher than the melting point of the back electrode. Hence, a physical deformation of the back electrode may be caused.

Accordingly, in the embodiment of the invention, it is preferable, but not required, that the back electrode including the low melting point solder is formed after the front electrode including the high melting point solder is formed.

Figure 10A:
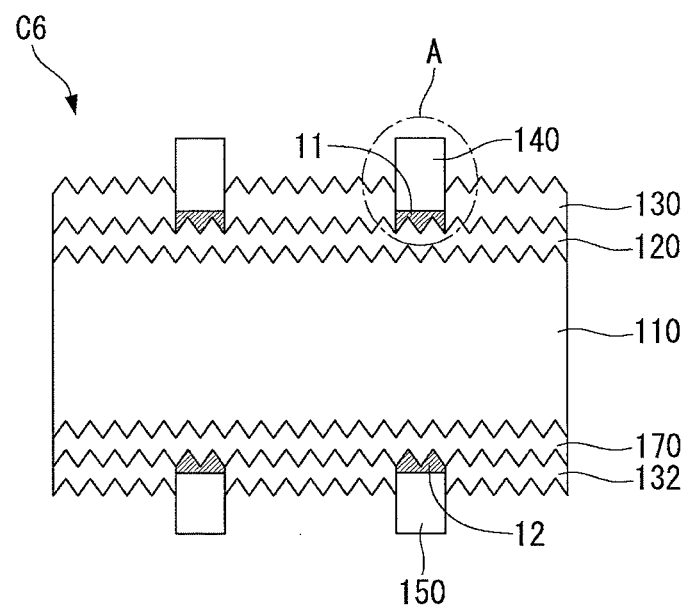
FIG. 10A shows another example of a solar cell shown in FIG. 6A.
Figure 10B:
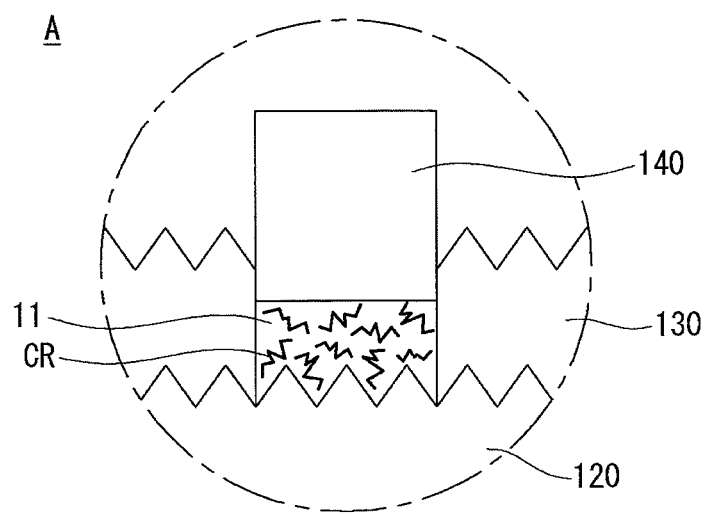
FIG. 10B is an enlarged view of a portion A shown in FIG. 10A.
Figure 11:
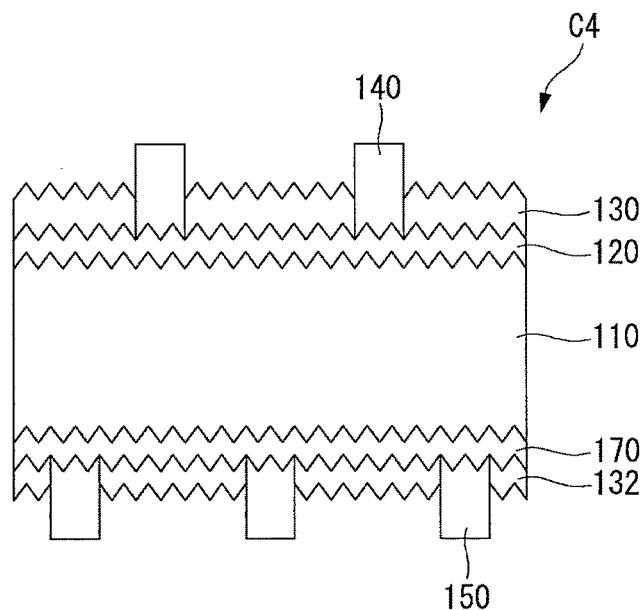
FIGS. 11 and 12 show another example of a solar cell shown in FIG. 6A.

FIG. 10A shows another example of the solar cell according to the embodiment of the invention, and FIG. 10B is an enlarged view of a portion A shown in FIG. 10A.

FIGS. 10A and 10B show another example of the electrode structure applicable to the solar cell according to the embodiment of the invention shown in FIGS. 8A and 8B.

The description duplicative with that illustrated in FIGS. 8A and 8B is omitted in FIGS. 10A and 10B, and only a difference between FIGS. 8A and 8B and FIGS. 10A and 10B is mainly described.

Thus, structures and components identical or equivalent to those illustrated in FIGS. 8A and 8B are designated with the same reference numerals, and a further description may be briefly made or may be entirely omitted in FIGS. 10A and 10B.

As shown in FIG. 10A, a sixth solar cell C6 according to a sixth embodiment of the invention may include first and second connection layers 11 and 12 positioned on a front surface and a back surface of a semiconductor substrate 110.

As shown in FIGS. 10A and 10B, the first connection layer 11 may be positioned on the front surface of the semiconductor substrate 110 and may be positioned between a first electrode 140 and an emitter region 120.

The first connection layer 11 may include a plurality of cracks CR and may electrically and physically connect the first electrode 140 to the emitter region 120 through the plurality of cracks CR.

When a cavitation phenomenon is generated in a portion of a first anti-reflection layer 130, on which a first metal solder 140a is applied, by ultrasonic vibration, the portion of the first anti-reflection layer 130 is not completely removed. In this instance, the first connection layer 11 may be formed as a layer including the cracks CR in a portion that is not removed by the cavitation phenomenon.

The first connection layer 11 may contain more of the first metal solder 140a than the first anti-reflection layer 130, so that the electrical and physical connection between the first connection layer 11 and the emitter region 120 is smoothly performed. Hence, a thickness of the first connection layer 11 may be less than or equal to a thickness of the first anti-reflection layer 130.

As shown in FIG. 10A, the second connection layer 12 may be positioned on the back surface of the semiconductor substrate 110 and may be positioned between a second electrode 150 and a back surface field region 170.

The second connection layer 12 may include a plurality of cracks CR and may electrically and physically connect the second electrode 150 to the back surface field region 170 through the plurality of cracks CR.

When a cavitation phenomenon is generated in a portion of a second anti-reflection layer 132, on which a second metal solder 150a is applied, by ultrasonic vibration, the portion of the second anti-reflection layer 132 is not completely removed. In this instance, the second connection layer 12 may be formed as a layer including the cracks CR in a portion that is not removed by the cavitation phenomenon.

A thickness of the second connection layer 12 may be less than or equal to a thickness of the second anti-reflection layer 132.

The second connection layer 12 may contain the second metal solder 150a more than the second anti-reflection layer 132, so that the electrical and physical connection between the second connection layer 12 and the back surface field region 170 is smoothly performed. Hence, the first and second connection layers 11 and 12 may have the same thickness or different thicknesses.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a solar cell module comprising:
    applying a first low melting point metal layer of a metal solder on a first electrode and a second electrode included on a tope surface in each of a plurality of solar cells;
    melting the first low melting point metal layer to form a contact layer on the first electrode;
    generating an ultrasonic vibration in the contact layer to remove a surface oxide layer formed on a surface of the first electrode while keeping an insulating layer disposed between a surface of the second electrode and the first low melting point metal layer;
    melting a surface metal of the first electrode and the contact layer to form a metal connection layer on the surface of the first electrode; and
    connecting the metal connection layer to a second low melting point metal layer of an interconnector.

2. The method of claim 1, wherein the removing of the surface oxide layer includes:
    generating the ultrasonic vibration in a surface of the contact layer;
    generating a cavitation phenomenon inside the contact layer by the ultrasonic vibration; and
    removing the surface oxide layer formed on the surface of the first electrode by the cavitation phenomenon.

3. The method of claim 1, wherein the connecting of the metal connection layer to the second low melting point metal layer of the interconnector includes melting a first low melting point metal of the metal connection layer and a second low melting point metal of the interconnector and bonding the metal connection layer to the interconnector.

4. The method of claim 1, wherein the ultrasonic vibration is generated by an ultrasonic tip.

5. The method of claim 1, further comprising, before applying the first low melting point metal layer, forming an insulating layer surrounding the first electrode.

6. The method of claim 1, further comprising forming the first electrode and the second electrode, wherein the forming of the first electrode and the second electrode includes:
    applying a first metal on a first surface of a semiconductor substrate;
    generating the ultrasonic vibration in the first metal to form the first electrode;
    applying a second metal on a second surface of the semiconductor substrate; and
    generating the ultrasonic vibration in the second metal to form the second electrode.

7. The method of claim 6, wherein the first metal is a high melting point metal, and the second metal is a low melting point metal.

8. The method of claim 7, wherein a melting point of the high melting point metal is equal to or higher than about 150° C., and a melting point of the low melting point metal is equal to or lower than about 150° C.

9. The method of claim 8, wherein the high melting point metal includes at least one conductive material of Sn—Ag—Cu, Sn—Zn, or Sn—Pb.

10. The method of claim 8, wherein an amount of tin (Sn) included in the high melting point metal is about 60 wt % to 100 wt %, and
    wherein an amount of tin (Sn) included in the low melting point metal is about 10 wt % to 60 wt %.

11. The method of claim 6, further comprising, before forming the first and second electrodes, forming a first anti-reflection layer on the first surface of the semiconductor substrate and forming a second anti-reflection layer on the second surface of the semiconductor substrate.

12. The method of claim 11, wherein the forming of the first electrode includes:
    generating a cavitation phenomenon by the ultrasonic vibration to etch a portion of the first anti-reflection layer; and
    connecting the first metal to the first surface of the semiconductor substrate through the etched portion of the first anti-reflection layer.

13. The method of claim 11, wherein the forming of the second electrode includes:

generating a cavitation phenomenon by the ultrasonic vibration to etch a portion of the second anti-reflection layer; and connecting the second metal to the second surface of the semiconductor substrate through the etched portion of the second anti-reflection layer.

14. The method of claim 12, further comprising forming a first connection layer between the first surface of the semiconductor substrate and the first electrode.

15. The method of claim 14, wherein the first connection layer is formed by generating cracks inside the first anti-reflection layer by the cavitation phenomenon.

16. The method of claim 15, wherein the first connection layer is formed by mixing the first anti-reflection layer with the first metal.

17. The method of claim 13, further comprising forming a second connection layer between the second surface of the semiconductor substrate and the second electrode.

18. The method of claim 17, wherein the second connection layer is formed by generating cracks inside the second anti-reflection layer by the cavitation phenomenon.

19. The method of claim 18, wherein the second connection layer is formed by mixing the second anti-reflection layer with the second metal.

20. The method of claim 6, wherein the first surface is a non-incident surface, on which light is not incident, and
wherein the second surface is an incident surface, on which light is incident.

* * * * *